US007045378B2

(12) United States Patent
Grein et al.

(10) Patent No.: US 7,045,378 B2
(45) Date of Patent: May 16, 2006

(54) FORMING A PHOTODIODE TO INCLUDE A SUPERLATTICE EXCLUSION LAYER

(75) Inventors: Christoph H. Grein, Wheaton, IL (US); Silviu Velicu, Westmont, IL (US); Sivalingam Sivananthan, Naperville, IL (US)

(73) Assignee: EPIR Technologies, Inc., Bolingbrook, IL (US)

( * ) Notice: Subject to any disclaimer, the term of this patent is extended or adjusted under 35 U.S.C. 154(b) by 0 days.

(21) Appl. No.: 10/951,330

(22) Filed: Sep. 24, 2004

(65) Prior Publication Data

US 2005/0040428 A1 Feb. 24, 2005

Related U.S. Application Data

(62) Division of application No. 10/354,687, filed on Jan. 30, 2003, now Pat. No. 6,906,358.

(51) Int. Cl.
*H01L 21/00* (2006.01)

(52) U.S. Cl. .............................. 438/47; 438/94; 438/95; 438/602

(58) Field of Classification Search ............ 438/36, 438/47, 94, 95, 191, 312, 602–604, 938
See application file for complete search history.

(56) References Cited

U.S. PATENT DOCUMENTS

| | | | |
|---|---|---|---|
| 4,679,061 A | 7/1987 | Capasso et al. | |
| 4,792,832 A * | 12/1988 | Baba et al. | 438/317 |
| 4,855,013 A | 8/1989 | Ohta et al. | |
| 5,016,073 A | 5/1991 | Elliott et al. | |
| 5,068,524 A | 11/1991 | Elliott et al. | |
| 5,366,927 A * | 11/1994 | Schetzina | 438/603 |
| 5,416,337 A | 5/1995 | Chang et al. | |
| 5,432,361 A | 7/1995 | Taguchi | |
| 5,625,637 A | 4/1997 | Mori et al. | |
| 5,783,838 A | 7/1998 | Kyozuka et al. | |
| 5,946,438 A | 8/1999 | Minot et al. | |
| 6,081,019 A | 6/2000 | White | |
| 6,229,162 B1 | 5/2001 | Watanabe | |
| 6,872,649 B1 * | 3/2005 | Nakamura et al. | 438/57 |
| 6,962,823 B1 * | 11/2005 | Empedocles et al. | 438/3 |
| 2003/0038213 A1 | 2/2003 | Brophy | |
| 2003/0166308 A1 | 9/2003 | Nakamura et al. | |
| 2004/0150002 A1 | 8/2004 | Grein et al. | |

OTHER PUBLICATIONS

Johnson, N F., et al., "Electronic and optical properties of III-V and II-VI semiconductor superlattices". Physical Review B, Feb. 15, 1990, pp. 3655-3669.

* cited by examiner

*Primary Examiner*—Kevin M. Picardat
(74) *Attorney, Agent, or Firm*—Daspin & Aument, LLP; Jefferson Perkins

(57) ABSTRACT

A photosensitive diode has superlattice exclusion region formed from a stack of first and second layers. The first layers are penetrated by minority carriers using quantum mechanical tunneling and reduce minority carrier mobility. The second layers have a sufficiently low bandgap that the tunneling minority carriers can reach an active region of the diode. The process of successively forming first and second layers is repeated until the exclusion region is at least three times the minority carrier diffusion length.

16 Claims, 6 Drawing Sheets

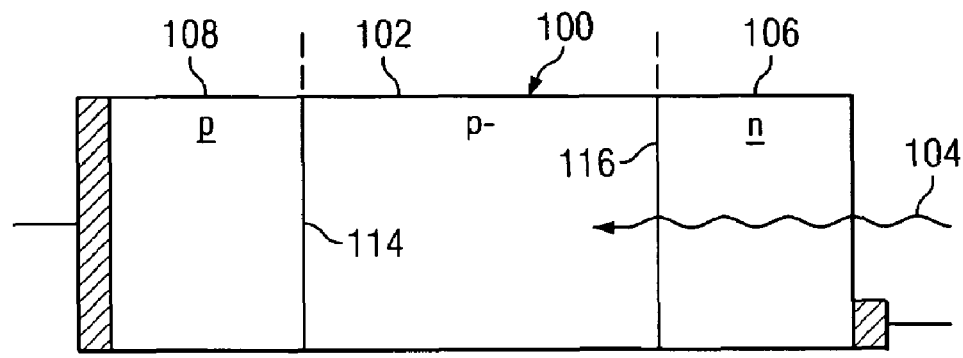
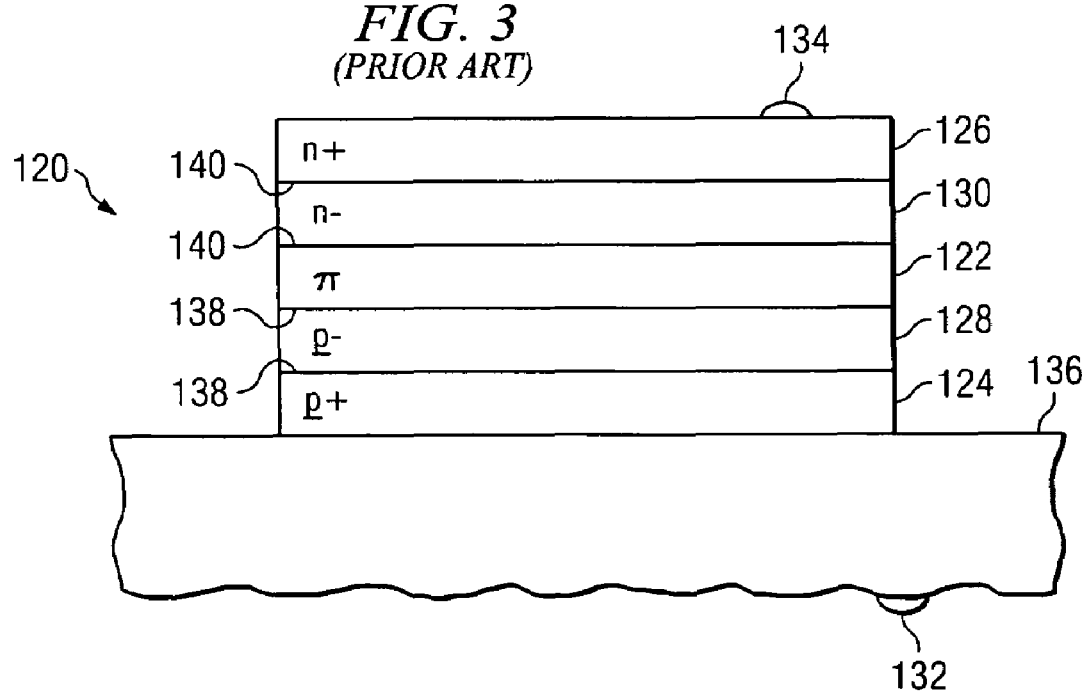

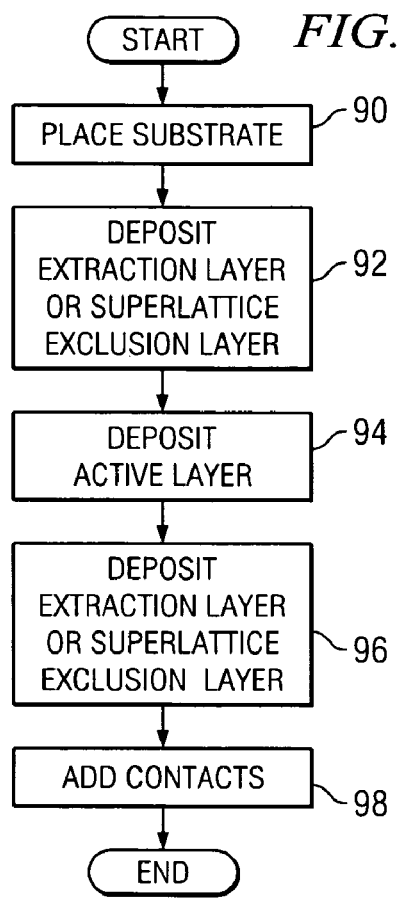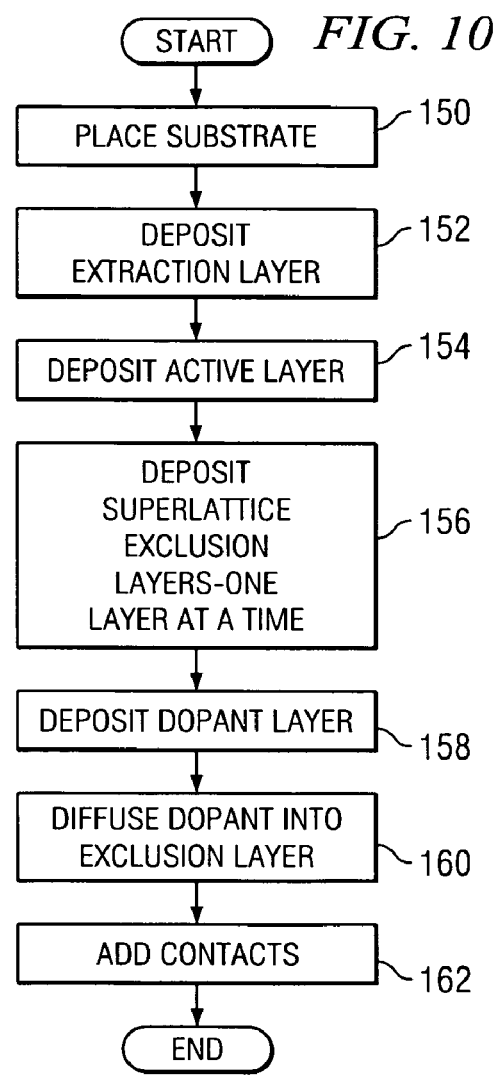

FORMING A PHOTODIODE TO INCLUDE A SUPERLATTICE EXCLUSION LAYER

RELATED APPLICATIONS

This Application is a division of U.S. patent application Ser. No. 10/354,687 filed Jan. 30, 2003, now U.S. Pat. No. 6,906,358 the specification of which is fully incorporated by reference herein.

TECHNICAL FIELD OF THE INVENTION

This invention generally relates to nonequilibrium photodetectors sensitive to infrared wavelengths of electromagnetic radiation, and more particularly to photodiodes having superlattice exclusion layers

BACKGROUND OF THE INVENTION

Known diodes such as photosensors or photodetectors have semiconductor layers for producing a detectable change in electric current, by exciting electrons across forbidden bands or band gaps in the electronic structure of the semiconductor material. The electrons are excited by photons received from light or electromagnetic waves from radiation intercepted by the photodetector.

Referring to FIG. 1, one type of photodiode is a High Operating Temperature (HOT) nonequilibrium photodiode such as that disclosed by U.S. Pat. No. 5,016,073 issued to Elliott et al. (the "'073 patent"). The HOT photodiode 100 has a photosensitive region 102 that absorbs incoming radiation in the form of infrared photons traveling through the photodiode along a pathway shown by arrow 104. The energy from the photons excites the electrons in the photosensitive region 102 across the band gap of the semiconductor material, which reduces resistivity and increases current running through the photodiode, and in turn indicates radiation has been detected.

The photosensitive region or active region or zone 102 is either lightly n-type, or as in this case, lightly p-type doped by ion implantation or in-situ doping in a concentration that is close to the natural or thermally generated majority carrier concentration. With this concentration, extrinsic behavior can be established in the active region 102 when the system is under reverse bias such that the impurities (dopants) contribute more carriers than the number of carriers generated thermally across the energy gap. The n-type dopants establish electronic levels that are closer to the conduction band than the valence band. This leads to indirect generation from the electronic levels that require less energy for an electron to jump from the level to the conduction band than an electron in direct generation from the valence band.

The active region 102 should have the minimum possible number of majority carriers in order to improve the detector's signal-to-noise ratio. This is because radiative and Auger generation-recombination processes are responsible for noise, and are less probable with lower majority carrier concentrations.

The desired majority carrier concentrations are obtained by reducing the number of minority carriers in the active region. A reduction of minority carriers in the space charge balance of the photosensitive region 102 results in a corresponding loss of natural majority carriers leaving a very small minority carrier concentration and a low natural majority carrier concentration that is less then the majority concentration provided by the dopant.

One way to minimize or suppress minority carrier concentrations is to cool the photodetector. This, however, involves complex, bulky and expensive equipment.

One alternative solution, as presented by the '073 patent, discloses a way to reduce the minority carrier concentration in the photosensitive region 102 on a $Cd_xHg_{1-x}Te$ (cadmium mercury telluride or CMT) photodiode 100 without the conventional cooling parameters. This is accomplished by placing the photosensitive region 102 between an extraction layer or region 106 and an exclusion layer or region 108. The overall effect of this structure is that minority carriers are removed at the extraction region or layer 106 and are not resupplied at the exclusion region or contact 108.

The extraction region 106 typically has the opposite majority carrier or conductivity type compared with that of the photosensitive region 102 and forms a p-n junction 116 with the photosensitive region. When a reverse bias is applied, the extraction region 106 extracts minority carriers from the photosensitive region 102 by electrons diffusing to the extraction region from the photosensitive region due to its lower conduction band energy, producing the effect of a "weir" or sink.

On the other side of the photosensitive region 102, the exclusion layer or region 108 is a bulk semiconductor layer that prevents minority carrier injection into the photosensitive region 102. The exclusion region 108 has the same conductivity type as the photosensitive region 102 defining a "pp" or "nn" junction or boundary 114 between the chemically different regions that establish different sizes of energy band gaps. The exclusion region 108 can be degenerately doped to be of the same conductivity type as the photosensitive region; i.e., the exclusion region is $n^+$ or $p^+$ according to whether the photosensitive region is n or p type respectively. In the alternative, the exclusion region is a heterojunction structure provided by a different and wider band gap semiconductor material, than in the photosensitive/active region 102 but with like majority carrier types, forming an nn or pp structure.

Electric fields and large external voltage drops over the exclusion region's length can drive the minority carriers toward the pp or nn junction 114 and into the photosensitive region 102. These are avoided by heavily doping the exclusion region 108. When the electric fields in the exclusion region are reduced enough or eliminated, the minority carriers are transported by diffusion.

The length of the exclusion region 108 is at least three times a minority carrier diffusion length to minimize or prevent the "in-diffusion" of minority carriers from the biasing contact. The '073 patent discloses that the exclusion layer thickness should be at least 150:m for doping $[N_A-N_D]>1\times10^{17}$ $cm^{-3}$ to prevent diffusion into the active region. More recent, and accurate calculations conclude that three minority carrier diffusion lengths is approximately 60:m for $[N_A-N_D]-1\times10^{17}$ $cm^{-3}$ for p-type, bulk $Hg_{0.7}Cd_{0.3}Te$ at a temperature of 230° K as shown in FIG. 2.

Regardless of this difference, attempting to provide a 60–150:m thick, bulk semiconductor exclusion region is extremely difficult as using Molecular Beam Epitaxy (MBE) crystal growth processes, as are typically employed for producing photodetectors or photodiodes.

Molecular Beam Epitaxy (MBE) is a chemical vapor deposition method in which a crystal or layered structure is grown on a template (substrate) within a chamber. The substrate is brought to, and kept at, a predefined growth temperature by a heating element typically placed behind the substrate. This is to ensure that sufficient energy is transferred to the substrate's surface to achieve specific reactions.

The structure is grown by providing atomic and/or molecular fluxes obtained by thermal evaporation of the charge materials. The growth process occurs in an ultra-high vacuum environment to minimize the presence of foreign atoms. Polycrystalline and/or amorphous materials are loaded into crucibles and constitute the charges. The fluxes are adjusted by controlling the temperatures of the charge materials. In this way, the incoming atoms/molecules from the charges have to spend a certain residence time on the surface while traveling/diffusing around in order to find a geometrical position that minimizes the surface energy. Shutters between the charges or charge materials in the effusion cells and substrate are individually controllable. They permit/forbid the flow of molecular beams of the particular materials that are desired at a particular time.

Since MBE has a typical growth rate of $10^{-10}$ m per second or about 2.5:m per hour (for growing a 60 μm thick HgCdTe bulk exclusion layer for instance), it requires a growth duration of 24 hours. This long amount of time requires a substantial expense in equipment, maintenance, raw material and labor per exclusion region. This expense per exclusion region could be reduced if the diffusion length of the carriers in the exclusion region could be reduced, which results in a reduced total thickness that is still three times the diffusion length of its carriers.

The MBE extended time period required for growing the relatively thick exclusion layers also causes defects in the growth or growing crystal itself. In the MBE process, solid source materials are evaporated by heating them in effusion cells in order to transport them onto the growing crystal. The process of evaporation changes the surface area, shape and roughness of the source material left behind in the effusion cell. This results in drifts or changes over time in the composition of the fluxes of the material leaving the effusion cell. The variation in material fluxes changes the ratios of the fluxes of the Hg to CdTe to Te sources used to make the crystal (or in other words a variation in the ratios of the flux of material from each effusion cell used). This will vary the composition, and can result in, for example, the establishment of an undesired energy gap. This random variation in energy gap can lead to absorption of infrared radiation in the exclusion layer. The varied composition can also create undesired barriers to carrier flow such that the exclusion layer blocks the flow of majority carriers. Finally, a varied composition can result in poor quality crystals with varying diffusion lengths resulting in unpredictable device performance.

Another problem that can occur in the MBE process of manufacturing thick bulk semiconductor exclusion layers is that while the crystal is thickened, it absorbs more infrared radiation from the substrate heater resulting in a rise in temperature over time. The power to the substrate heater is ramped down in order to compensate for the rise in temperature. However, the ramping down of the power frequently cannot be perfectly matched to the temperature rise because conflicting temperature requirements exist that are associated with emissivity as the crystal grows and require temperature durations not related to the rise in temperature. These variations in growth temperature lead to variations in material composition, and in turn, variations in crystal quality.

In another alternative, disclosed by U.S. Pat. No. 6,081,019 issued to White and fully incorporated herein, and which is illustrated in FIG. 3, a HOT photodiode 120 is provided with a buffer layer 128 between the exclusion layer 124 and the active layer 122, and a buffer layer 130 between the extraction layer 126 and active layer 122. The layers are disposed on a growth substrate 136 and are biased through contacts or electrodes 132, 134.

Each buffer layer 130, 128 acts as an additional exclusion and extraction layer according to the side (exclusion side or extraction side) of the active layer they are disposed on. The buffer layers 130, 128 have lower dopant concentrations than their corresponding extraction or exclusion layer, although the CMT chemical composition of the layers is otherwise the same as the corresponding extraction or exclusion layer. The chemical composition of the active layer is different than that in the buffer layers so that the buffer layers provide a wider band gap than that in the active layer and with much lower (10 to 100 times) concentration of minority carriers. This results in two extraction interfaces 140 on either side of the extraction buffer layer 130 and two exclusion interfaces 138 on either side of the exclusion buffer layer 128. The buffer layers 128, 130 provide a low minority carrier concentration at low doping regions close to the junctions, preventing high thermal generation leading to leakage current.

The "buffered" diode in the '019 patent, however, has a total composite exclusion semiconductor region (126 and 130) thickness of 7.0 μm, which is substantially below the thickness of three times the diffusion length of minority carriers (approximately 60 μm for CMT) which is desired for high quality bulk material crystals. Such thin layers accordingly sacrifice quality and performance by permitting unacceptable levels of minority carriers to diffuse into the active layer.

In addition, while the buffer layers 128, 130 are actually "buffering" the dopants themselves (i.e. the dopant atoms) and provide for a relatively thicker exclusion region to counter some diffusion length, the composition of the buffer layers 128, 130 do not provide a stronger physical barrier to minority carriers. In other words, the same general proportion of minority carriers that would diffuse from the exclusion layer 124 and into the active region 122 would also diffuse from the buffer layer 128 if they occupied the same position relative to the biasing contact.

SUMMARY OF THE INVENTION

According to one aspect of the present invention, a semiconductor superlattice rather than a bulk semiconductor is used to form a photodetector or photodiode exclusion region. The use of a superlattice reduces both mobility and diffusion length of minority carriers, which in turn reduces the required total exclusion region thickness (i.e., the three× diffusion length) for producing high quality photodiodes.

Specifically, a photosensitive diode has an active region defining a majority carrier of a first conductivity type and a minority carrier of a second conductivity type. At least one extraction region is disposed on a first side of the active region and has a majority carrier of the second conductivity type. Carriers of the second conductivity type are extracted from the active region and into the extraction region under a condition of reverse bias. At least one exclusion region is disposed on a second side of the active region and has a majority carrier of the first conductivity type. The exclusion region prevents entry of its minority carriers, which are of the second conductivity type, into the active region while in a condition of reverse bias. The exclusion region includes a superlattice with a plurality of layers.

At least two biasing contacts apply the reverse bias through the photodiode and enable a flow of the carriers of the second conductivity type from the exclusion region to the active region, and from the active region to the extraction region. One contact is coupled to the exclusion region, and the other contact is coupled to the extraction region.

In another aspect of the present invention, the superlattice exclusion region has (a) a total thickness approximately at least three times a diffusion length of the minority carrier in a direction perpendicular to the layers that form the superlattice, (b) a plurality of first "barrier" layers forming barriers that the minority carriers in the exclusion region must perform quantum mechanical tunneling in order to penetrate through, and (c) a plurality of second "well" layers generally disposed in alternating relation with the first layers and having energy band gaps which are low enough so that the minority carriers in the exclusion region prefer to reside in the second well layers and are required to tunnel through the first barrier layers in order to reach the active region.

In yet another aspect of the present invention, a method of forming a diode includes the steps of first forming a plurality of thin layers of different compositions on top of each other to form a superlattice exclusion region of the diode, and then forming a dopant diffusion layer on the superlattice exclusion region. The dopant is diffused from the dopant diffusion layer into the superlattice exclusion region.

Methods for operating the superlattice exclusion region diodes are also disclosed.

Thus, it has been determined that the exclusion region or layer of a photodetector or photodiode can be easily and accurately produced without diminishing the performance characteristics of the exclusion region.

BRIEF DESCRIPTION OF THE DRAWINGS

FIG. 1 is a simplified schematic drawing showing the layers of a known photodetector diode;

FIG. 3 is a simplified schematic drawing showing the layers of another known photodetector diode;

FIG. 9 is a flow chart for manufacturing the superlattice photodetector according to the present invention;

FIG. 10 is a flow chart for manufacturing a p-type HgTe/CdTe superlattice on the photodetector of the present invention.

DETAILED DESCRIPTION OF THE PREFERRED EMBODIMENT

Figure 2:
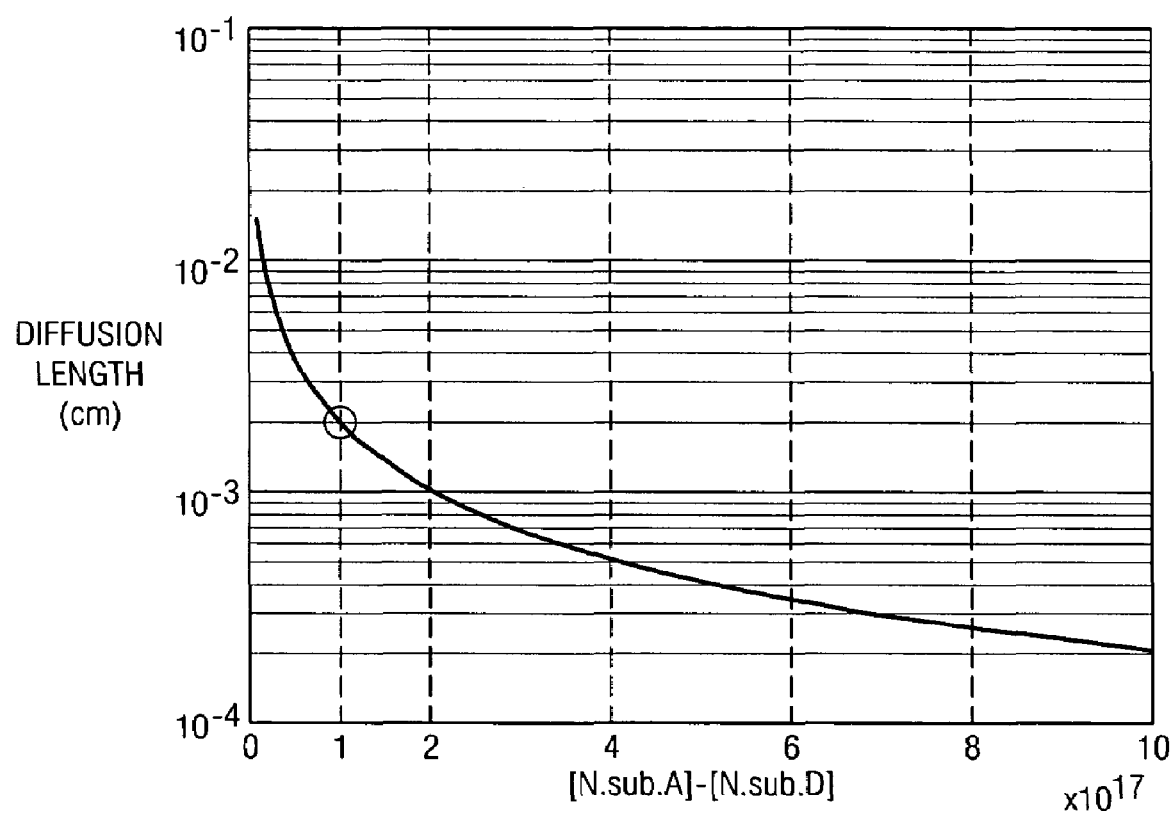
FIG. 2 is a chart showing the relationship between electron diffusion length in p-type $Hg_{0.7}Cd_{0.3}Te$ at 230° K and dopant count $([N_A]-[N_D]) \times 10^{17}$ cm$^{-3}$.
Figure 4:
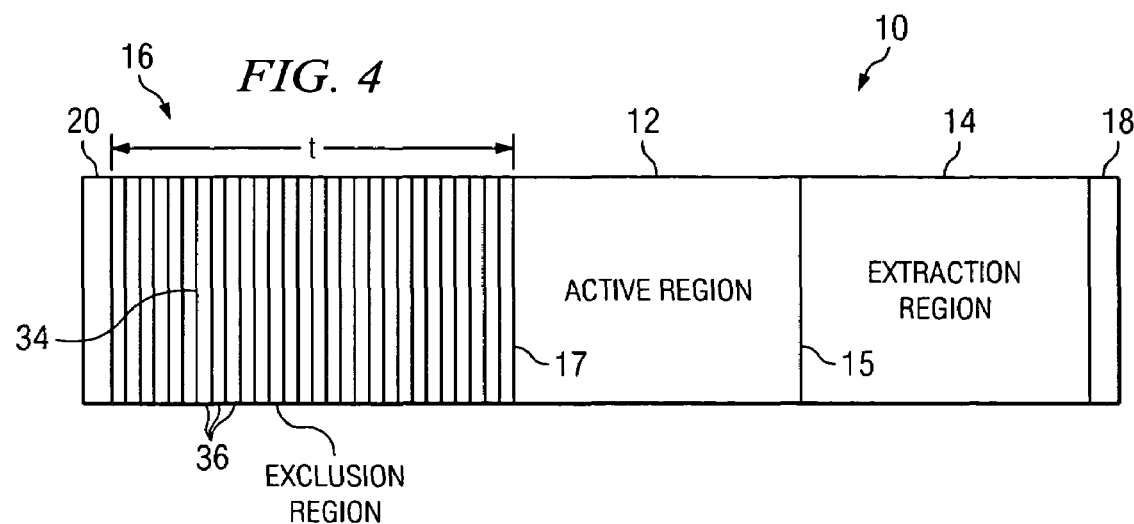
FIG. 4 is a simplified schematic drawing of a photodiode according to the present invention.

Referring to FIG. 4, a diode 10 has a number of epitaxial layers or regions including a photosensitive active region 12, an extraction region 14 formed on one side or face of the active region 12, and an exclusion region indicated generally at 16 on another side of the active region 12. While the extraction region 14 is shown on the opposite side of the exclusion region 16 for the preferred embodiment, it will be understood that they need not be opposite one another as long as they are properly placed in order along a current or bias path. In this case, two biasing contacts or electrodes 18, 20 coupled to the outer ends of the extraction and exclusion regions, respectively, provide a reverse bias through the diode and regions 12, 14 and 16 at approximately 1 volt.

Active region 12 and extraction region 14 are both made of $Cd_xHg_{1-x}Te$ (cadmium mercury telluride or CMT). For active region 12, x=0.265 for an operating temperature of 295° K (to achieve an optical cut-off of wavelength $\lambda_c \approx 5.0$ µm), and x=0.19 for an operating temperature of 190° K ($\lambda_c$=11.0 µm). For extraction region 14, x/0.45 for an operating temperature of 295° K ($\lambda_c$<2.5 µm), and x/0.27 for an operating temperature of 190° K ($\lambda_c$<5.5 µm).

The active region 12 should be lightly p-type or n-type doped preferably at $1 \times 10^{15}$ cm$^{-3}$ but at most $5 \times 10^{16}$ cm$^{-3}$ with Au or As so that the active region behaves intrinsically at the operating temperature under no bias (unbiased condition). Here, intrinsic behavior refers to the situation where the number of carriers generated by any dopants or impurities does not exceed the number of thermally generated or "natural" carriers. Thus, in the intrinsic state and in thermal equilibrium, the density of holes and electrons are the same so that the rate of recombination equals the rate of thermal generation. Intrinsic behavior under zero bias ensures that once the diode 10 is under a reverse bias, it will release minority carriers for extraction from the active region as long as the doping is not too heavy. The active region 12 will then be out of thermal equilibrium and act extrinsically, providing most generation from the dopant majority carriers, providing an efficient, sensitive diode.

The extraction region 14 is heavily doped with a dopant having a conductivity type opposite from the conductivity type of the active region 12 such as I or In in order to attract the minority carriers away from the active region under reverse bias and at the operating temperature. This forms extrinsic behavior at the extraction region 14 while under the unbiased condition at the operating temperature, which indicates that a low saturation current will be established under reverse bias that will extract the minority carriers across a p-n junction 15 formed at the junction of the active and extraction regions 12, 14.

It will be appreciated by one skilled in the art that statements herein regarding the act of the extraction region extracting only minority carriers from the active region is a generalization that refers to the carrier activity at the p-n junction 15 under reverse bias. In this situation, the high potential energy barrier at the p-n junction 15 blocks majority carriers from exiting the active region 12 while permitting minority carriers to be extracted through the p-n junction 15 and into the extraction region 14 with the reverse bias current. However, the extraction region 14 may also include a pn heterojunction of gradual composition change (graded construction) to avoid a barrier to conduction.

The exclusion region 16 is preferably the same conductivity type as the active region 12 and forms a pp or nn boundary or heterojunction 17 with active region 12. Active region 12 is less than or approximately equal to a minority carrier diffusion length from junction 17 to junction 15.

When the active region 12 is lightly doped p-type, the exclusion region 16 is also doped p-type with Au or As although heavily doped, the extraction region 14 is heavily doped n-type, and the minority carriers are electrons as defined by the active region. In the opposite conductivity configuration, when the active region 12 is lightly doped n-type, the exclusion region 16 is heavily doped n-type, the extraction region 14 is heavily doped p-type and the minority carriers are holes as defined by the active region.

The exclusion region 16 should have a total thickness t (FIG. 4) at least three minority carrier diffusion lengths in the general direction of current flow through the diode (or growth direction of the exclusion region as explained in conjunction with FIG. 5 below) for high quality performance. One way to reduce the required thickness of the exclusion region 16 is to reduce the diffusion length of the minority carrier. This can be accomplished by reducing the mobility of the minority carrier because the distance or length that a carrier will diffuse from a current producing contact, and within a semiconductor region, increases with an increase in the carrier's mobility, lifetime or temperature. Diffusion length is proportional to the square root of the mobility.

Referring to FIG. 4, in order to reduce the mobility of the minority carrier in the exclusion layer 16, a superlattice indicated generally at 34 can be used to form the exclusion layer. Superlattice 34 is an artificially structured material composed of two or more types of crystals (i.e. composed of different atoms, materials or chemical compositions) periodically arranged in layers 36 as shown in FIG. 4.

Figure 5:
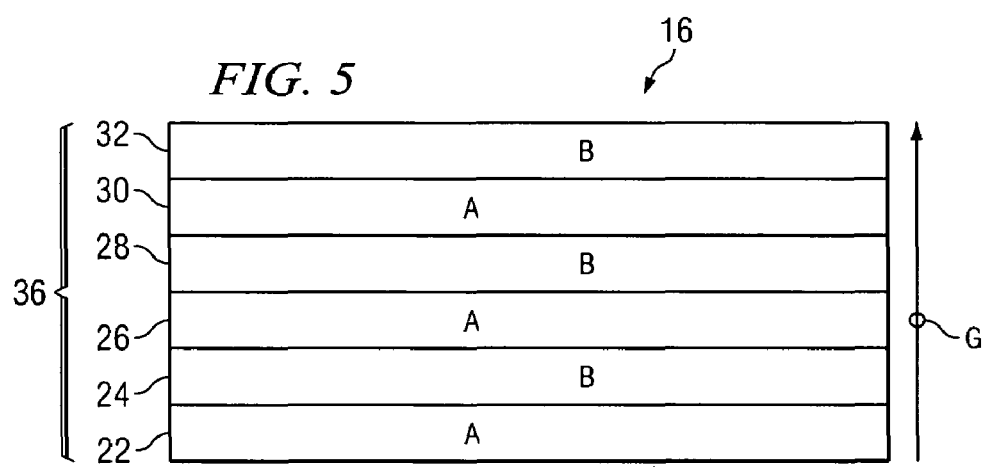
FIG. 5 is a simplified schematic sectional view showing the layer sequence of a superlattice according to the present invention.

Referring to FIG. 5, layers 36 in superlattice 34 are composed of either of two types of crystals or crystal layers labeled A (layers 22, 26, 30) and B (layers 24, 28, 32). In one embodiment the A layers are HgTe, and the B layers are CdTe. Alternatively, other compositions can be used for the layers A and B such as alternating layers of $Hg_{1-x}Cd_xTe$ and $Hg_{1-y}Cd_yTe$ respectively where x and y are not equal to each other and are preferably both less than 0.4.

In another alternative, layers A and B can be InAs and $In_xGa_{1-x}Sb$. For holes, InAs layers are barrier layers and $In_xGa_{1-x}Sb$ layers are well layers. However, for electrons, InAs layers are well layers and $In_xGa_{1-x}Sb$ layers are barrier layers. Since both carrier types are present in the exclusion region whether it is doped p-type or n-type, each A and B layer acts as both well and barrier depending on which carrier type is being discussed.

However, for the purposes of this application, when the exclusion region is p-type, and one of the main purposes of the exclusion region is to prevent holes (the minority carrier for the active region) from entering the active region 12, we will define or discuss the InAs layers as being at least the A (well) layers while the $In_xGa_{1-x}Sb$ are at least the B (barrier) layers. Similarly, when the exclusion region 16 is n-type and the concern is blocking electrons from entering the active region 12, then we will define the $In_xGa_{1-x}Sb$ layers as being at least the A well layers while the InAs layers are in at least the B barrier layers. In both of these cases, x is preferably less than 0.25.

These superlattice layer composition ranges mentioned above have been found to meet the criteria necessary to form an effective superlattice sensing infrared radiation as disclosed below. However, it will be appreciated that many other compositions may be found that also meet the criteria, and therefore fall within the scope of the present invention.

Every A layer is a uniform thickness, and every B layer is a uniform thickness, although A layers are not necessarily the same thickness as B layers. The thickness of each layer A and B must be greater than the interatomic spacing of the atoms in the involved crystals, and is typically generally chosen to be in the range of 1–10 nm. For infrared applications, the preferred HgTe/CdTe superlattice 34 has HgTe 'A' layers approximately equal to or thicker than $20 \times 10^{-10}$ m (2 nm) and equal to or thinner than $80 \times 10^{-10}$ m (8 nm), whereas CdTe 'B' layers are approximately equal to or thicker than $40 \times 10^{-10}$ m (4 nm) and equal to or thinner than $100 \times 10^{-10}$ m (10 nm). The total number of layers along the growth direction of the superlattice as shown by arrow G (FIG. 5) is at least one hundred crystal layers 36 (A and B) to ensure superlattice behavior (rather than bulk behavior). Many more layers may be required to achieve the three-times diffusion length total thickness. A doping level ($[N_A]-[N_D]$) of As approximately at or above $1 \times 10^{17}$ cm$^{-3}$ is preferred for the superlattice 34.

The superlattice effectively reduces carrier mobility due to: (i) layers in the superlattice that are true barriers to minority carrier transport (rather than merely blocking dopant transport) give rise to larger effective masses in the superlattice growth direction of the carriers compared to the effective masses of bulk crystals, and (ii) increased scattering from disordered atomic arrangements at the interfaces between superlattice layers which reduces the amount of minority carriers reaching the active region 12 by diffusion. While the importance of (ii) disordered atomic arrangements at interfaces may vary from one superlattice to another depending on growth conditions and device processing, (i) larger effective mass is a controllable, consistent characteristic of superlattices and can be intentionally varied by the choice of layer materials and layer thicknesses. As such, this invention exploits (i) to yield reproducible results. Increasing the effective mass of a carrier leads to a proportional decrease in the carrier's mobility. Thus, other compositions may be used for layers A and B as long as it prevents minority carriers from diffusing into the active region 12 for at least reason (i) while providing or contributing to the diffusion thickness of the exclusion region.

Figure 7:
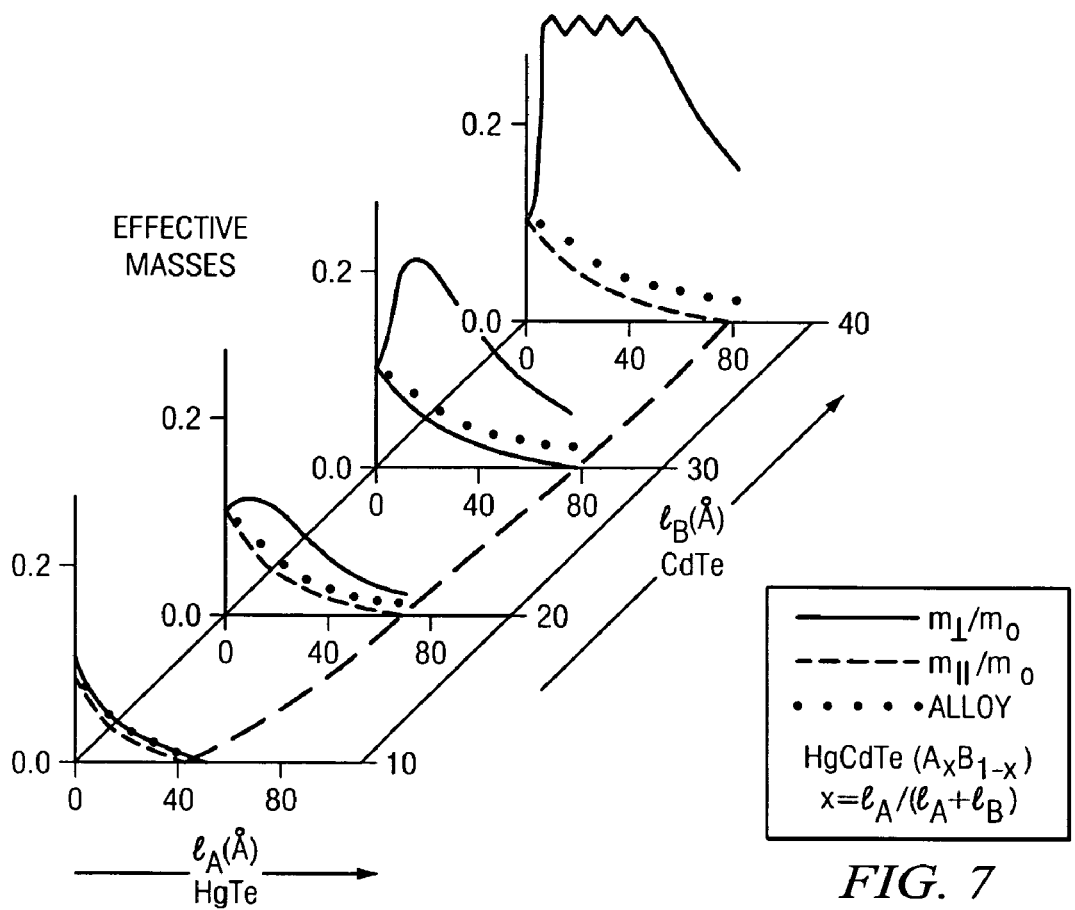
FIG. 7 is a three-dimensional chart showing the relationship between electron effective mass and the thicknesses of HgTe and CdTe layers in the superlattice according to the present invention, and between electron effective mass and a bulk semiconductor alloy of HgCdTe as in the prior art.

Referring to FIG. 7, in one example, electron effective masses of HgTe/CdTe superlattices are graphed by theoretical computation as disclosed by Johnson et al., "Electronic and optical properties of III–V and II–VI Semiconductor Superlattices," *Phys. Rev. B*. vol. 41, No. 6, Feb. 15, 1990, pp. 3655–69 which explains the indication of the presence of tunneling barriers by determining effective mass. The electron effective mass relevant to this invention is called the growth direction effective mass and is labeled $m_\zeta$, where "ζ" refers to the superlattice growth direction. "$m_o$" is the free electron mass, equal to $9.11 \times 10^{-31}$ kg.

The graph of FIG. 7 shows a plot of the growth direction effective mass as a function of the HgTe layer thickness $l_A$ and CdTe layer thickness $l_B$. It demonstrates that the growth direction effective mass increases rapidly with increasing CdTe layer thickness but that increasing the HgTe layer thickness beyond a certain maximum around 10 Å reduces effective mass. The graph also shows that when the superlattice is made from alternating layers of A/B, the corresponding bulk alloy for proper comparison to the superlattice is a bulk alloy made of $A_xB_{1-x}$ where $x=l_A/(l_A+l_B)$.

Here it is shown that the electron effective mass of an HgTe/CdTe superlattice is greater than the electron effective mass of bulk alloy HgCdTe (plotted with a dotted line) with the same energy gap. This occurs because the CdTe layers behave as real barriers to electron flow—not just dopant flow. The CdTe layers require the minority carriers to behave on the quantum level and perform quantum mechanical tunneling in order to penetrate barriers in the CdTe layers. This substantially slows down and reduces the motion of the minority carriers, and in turn the mobility of carriers. Thus, diffusion length of minority carriers is reduced as is the amount of minority carriers reaching the active region 12.

The effective masses are predicted to be up to approximately a factor of ten greater than those of bulk alloy HgCdTe, which results in a factor-of-ten reduction in the electron mobility and a factor of about 3.2 (the square root of 10) reduction in diffusion length. Thus, a 60:m total thickness minimum requirement for an HgCdTe exclusion region based on three times the diffusion length is reduced to approximately 19:m total thickness or smaller without sacrificing quality of the crystal and performance level and while reducing the growth time of a single platter of the exclusion region by more than ⅔ from 24 hours to about 7.6 hours per exclusion region.

Figure 8:
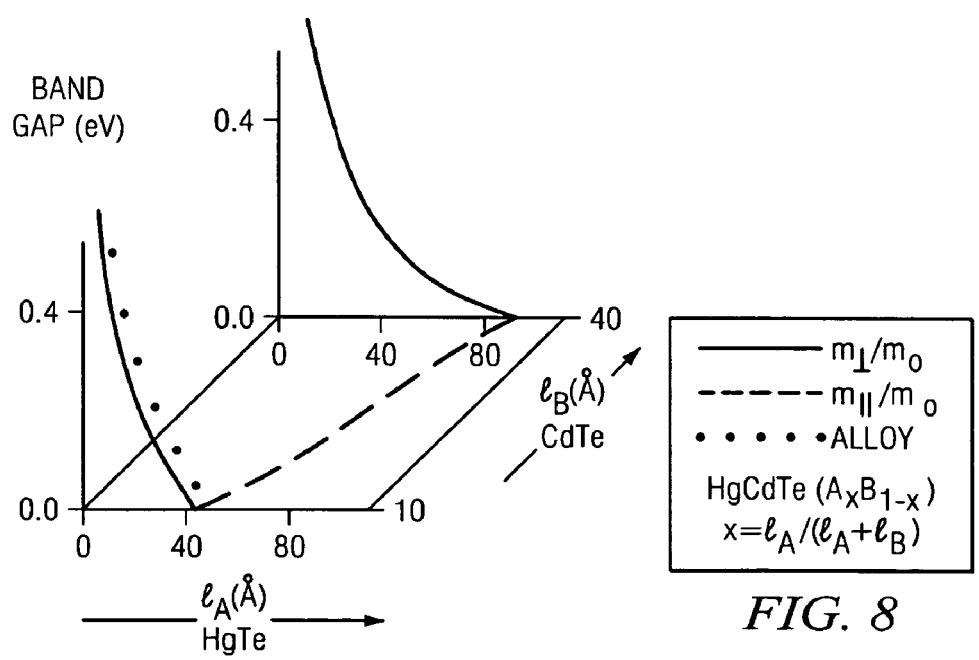
FIG. 8 is a three-dimensional chart showing the relationship between energy band gap and the thicknesses of HgTe and CdTe layers in the superlattice according to the present invention, and between energy band gap and a bulk semiconductor alloy of HgCdTe as in the prior art.

Referring to FIG. 8, a graph shows the energy band gap of the superlattice as a function of the HgTe layer thickness $l_A$ and CdTe layer thickness $l_B$. The graph of FIG. 8 demonstrates that the band gap varies more with changes in HgTe layer thickness than with CdTe layer thickness. As such, a superlattice can be designed to possess large growth direction effective masses due to wide CdTe 'B' layers (about 4 nm to 10 nm each) to provide effective tunneling barriers, while providing small band gaps due to thin HgTe 'A' layers (about 2 nm to 8 nm each). The narrower band gap 'A' layers form quantum wells where the carriers prefer to reside (or are attracted to) because the carriers continuously look to minimize their energy which can be accomplished in the narrower band gap material.

The carriers that do not simply bounce off of the wider band gap barrier 'B' layers surrounding the well 'A' layers (and that actually penetrate the 'B' layers) are forced to tunnel through the 'B' layers in order to reach the active region 12. The probability of tunneling through the barrier 'B' layers is controlled by controlling the thickness of the 'B' layers. The 'A' layers will be referred to as the "well" layers, and 'B' layers will be referred to as the "barrier" layers.

For InAs and $In_xGa_{1-x}Sb$ superlattices, due to their type II band alignment, the layers are well or barrier layers depending on whether the superlattice exclusion region 16 conductivity is p-type or n-type. When the exclusion region 16 is p-type, the electron minority carriers treat the InAs layers as well layers and the $In_xGa_{1-x}Sb$ layers as barrier layers. When the exclusion region 16 is n-type, however, hole minority carriers treat the $In_xGa_{1-x}Sb$ layers as well layers and the InAs layers as barrier layers.

In order to achieve this superlattice effect, the superlattice should have at least 100 layers total. However, assuming the same number of 'A' (HgTe) layers as 'B' (CdTe) layers is used in the superlattice 34, the superlattice in this illustrated embodiment preferably has at least about 1055 layers each for a total of 2110 layers to establish an ideal exclusion region thickness three times the diffusion length (19:m). It will also be appreciated that performance as measured by the number of photons absorbed will increase generally linearly with an increase in the number of layers starting with a minimal 100 'A' and 'B' layers 36 and up to the ideal (3×diffusion length) number of layers.

Referring to FIGS. 4–5 and 9, superlattice 34 can be grown by a number of crystal growth techniques, including as performed here, molecular beam epitaxy which permits a superlattice to be grown with the appropriate periodic shutter opening/closing sequence as explained above. For growing a crystal of HgTe/CdTe or HgCdTe, a substrate (not shown) of $Cd_yZn_{1-x}Te$ or Si is used. For growing a crystal of $InAs/In_xGa_{1-x}Sb$, a substrate of GaSb is used. These substrates are typically transparent to infrared radiation. The appropriate substrate is placed in the MBE growth chamber and heated as required (steps 90 or 150).

For a diode with HgCdTe and any composition diode with an n-type active layer and n-type exclusion layer, it does not matter which region (exclusion layer 16 or extraction layer 14) is grown as the first layer in the stack forming the diode 10 (step 92) on the substrate (not shown).

In step 92, assuming the exclusion region 16 is being grown, superlattice 34 is grown one layer at a time, alternating the crystal type periodically to create a desired structure as shown in FIG. 5. It does not matter which layer (A or B) is the first layer placed directly on the biasing contact 18 or 20, and likewise, it does not matter which layer (A or B) is the last layer in direct contact with the active region 12. The superlattice layers A and B may also be formed with configurations other than only the alternating of layer A with layer B. Other configurations such as every two or three layers being alternated may be used to make one type of layer composite larger than the other.

A principal advantage of the use of superlattices over single or bulk crystals, in addition to the reduction in diffusion length already discussed, is that superlattices possess more degrees of freedom in their design and fabrication which can be exploited to produce other desirable electronic properties. For example, the superlattice design as shown in FIG. 5 has five degrees of freedom: (i) the composition of crystal A; (ii) the composition of crystal B; (iii) the thickness of the layers composed of crystal A; (iv) the thickness of the layers composed of crystal B, and (v) the total number of layers. In contrast, a single crystal would have only two degrees of freedom: (i) the material type of the crystal, and (ii) the thickness of the crystal.

Next, the active region 12 is deposited (step 94) and then the other region (14 or 16) not yet formed is deposited (step 96). During the process, the regions 12, 14 and 16 are also doped either post growth or in situ during growth by known methods after each region is formed.

Referring to FIG. 10, when either p-type $Hg_{1-x}Cd_xTe/Hg_{1-y}Cd_yTe$ or p-type HgTe/CdTe superlattices are desired (e.g. when the active region 12 is p-type), post-growth ion implantation followed by annealing cannot be used to dope the superlattice 34 because temperatures held at greater than 220° C. for more than 12 hours cause the layers A and B to intermix, destroying the desired atomic structure. Usually, for p-type doping of CMT material, 250° C. for more than 12 hours is desired.

In order to avoid this problem, the superlattice 34 is built on the top of the formed stack where a p-type dopant can be diffused into the superlattice instead. Thus, the extraction region 14 is deposited first (step 152). Then the active region 12 is deposited (step 154). During the growth of regions 12 and 14, in-situ doping is performed for regions 12 and 14 to dope as required. Then, the exclusion region 16 is deposited with a superlattice 34 formed a layer at a time as explained for the process of FIG. 9 (step 156). Now, with the superlattice 34 on the top of the structure, a dopant diffusing layer (step 158), such as Au, is deposited on the superlattice 34. Heat at temperatures of 150 to 200° C. is then applied to the structure which diffuses p-type dopants into the superlattice 34 (step 160). This step requires a relatively much shorter time period and temperature to dope than post-growth annealing after ion implantation.

Figure 11A:
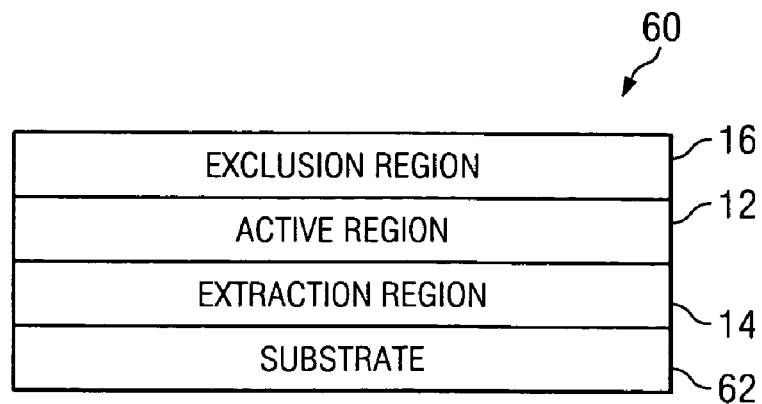
FIGS. 11A–11C are schematic diagrams showing some of the steps in the construction of a photodiode according to the present invention.
Figure 11B:
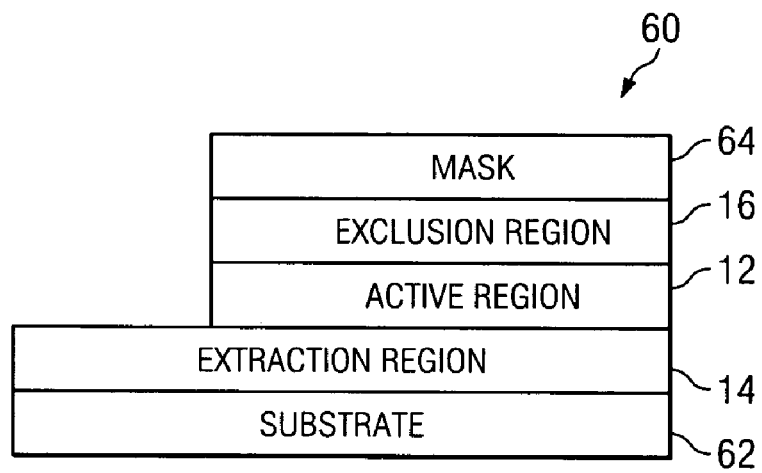
Figure 11C:
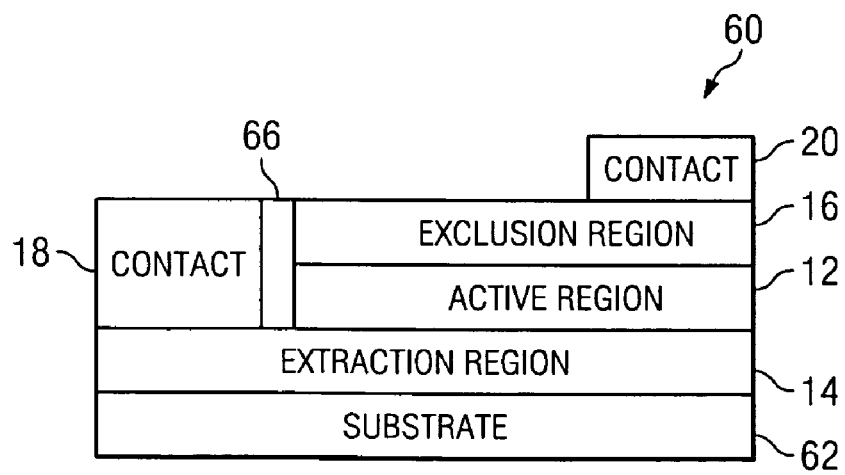

Referring to FIGS. 11A–11C, after the MBE process, the four layer structure 60 including a substrate 62 (FIG. 11A) is taken out of the MBE chamber (not shown) for adding contacts 18 and 20 (step 98 or 162 for FIGS. 9–10) to the diode.

To add the contacts, first, a mask 64 is applied to the top of the structure 60 so that a portion is exposed as shown in FIG. 11B. This portion is trench etched with chemicals known in the art. The mask 64 is then removed and, as shown in FIG. 11C, an insulation or passivation region or sidewall 66 is applied to the exposed sides of regions 12, 16. The contact metals 18, 70 are then deposited to complete the diode. The contact 18 in the etched area forms the contact on the extraction region side while the top contact 20 forms the exclusion region contact. It will be appreciated that many other forms for the diode will work sufficiently.

It will be appreciated that a more complex structure that includes both superlattice and bulk crystal layers or regions in the exclusion region 16 is also achievable with an appropriate shutter sequence in the MBE process and is considered to be within the scope of the invention. Thus, any portion of the exclusion region 16 may have a superlattice, whether a contact end adjacent the contact 20, an active region end adjacent the active region 12, or a middle portion of the exclusion region 16. The exclusion region 16 may also have more than one superlattice area or structure divided by exclusion bulk semiconductor areas or areas that have other purposes other than merely or solely exclusion.

It will also be understood that while not nearly as advantageous, other processes such as LPE (Liquid Phase Epitaxy) or MOCVD (Metal-Organic Chemical Vapor Deposition) can be tsed instead of MBE in order to form the diode 10.

After these MBE layers are formed, and after subsequent passivation and contact connection steps, arrays of those devices can be furnished with circuits for applying reverse bias and obtaining readout of signals produced by incident radiation. These diodes are connected to such circuitry by methods known in the art, as by metallization.

Figure 6:
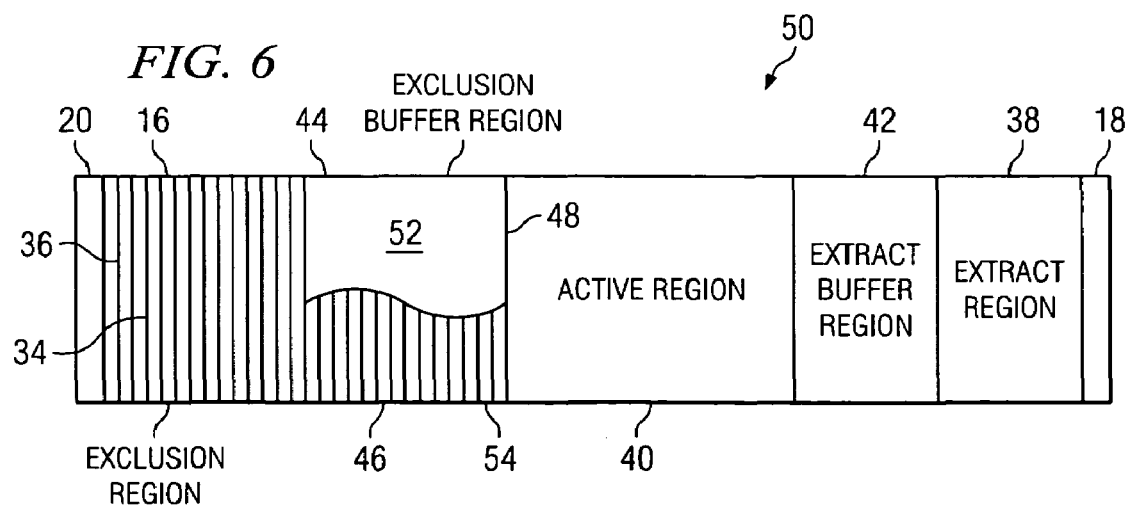
FIG. 6 is a simplified schematic drawing of another photodiode according to the present invention.

Referring to FIG. 6, in another alternative, a photodiode indicated generally at 50 has an extraction region 38, an extraction buffer region 42, an active region 40, an exclusion buffer region 44 and an exclusion region 16. Features similar to those found in diode 10 are numbered the same for diode 50. The superlattice exclusion region 16 is as described previously in one alternative. In another alternative, exclusion region 16 is described as before except that it is doped with $3 \times 10^{17}$ cm$^{-3}$ of As.

For the illustrated embodiment, the active region 40 is $Cd_xHg_{1-x}Te$ where x=0.18 and is preferably lightly p-type doped with $1 \times 10^{15}$ cm$^{-3}$ of As but is no greater than $5 \times 10^{16}$ cm$^{-3}$. It is also preferably about 4.0:m thick. The extraction region 38 is $Cd_xHg_{1-x}Te$ where x=0.28, is heavily n-type doped with $3 \times 10^{17}$ cm$^{-3}$ of I, and is about 3.5:m thick.

The extraction buffer region 42 is made of the same composition as the extraction region ($Cd_xHg_{1-x}Te$ where x=0.28) except with less dopant ($1 \times 10^{15}$ cm$^{-3}$ of I) resulting in a wider band gap than in the active region 40.

The exclusion buffer region 44 can either be made of a bulk semiconductor 52 of $Cd_xHg_{1-x}Te$ where x=0.35 and is doped with $1 \times 10^{15}$ cm$^{-3}$ of As, or it can be the same superlattice composition as the exclusion region 16 with superlattice layers 46 that continue the superlattice pattern with the same chemical composition from exclusion region 16 except with doping of $1 \times 10^{15}$ cm$^{-3}$ of As. This also results in a wider band gap in the exclusion buffer region 44 than in the active region 40.

Superlattice 46 has A and B layers 54 that are lightly doped close to the doping concentration of the active layer 40 and has a much lower minority carrier concentration than the concentration in the exclusion region 16. This will further create buffers to dopant flow while reducing current leakage at the p-n junction 48. It will be appreciated that the "well" 'A' layers of the buffer superlattice 46 should have a band gap that is generally, and relatively, narrower than the band gap of the barrier layers and greater than the band gap of the active region in order to effectively establish the buffer to block dopant flow while also providing an actual barrier to minority carrier diffusion.

In one alternative, the exclusion region 16 accounts for the entire 3×diffusion length, and as another alternative, the thickness of the exclusion region 16 plus the thickness of the exclusion buffer region 44 accounts for the 3×diffusion length.

The advantages of the present invention are now apparent. A diode 10 has an exclusion region 16 that has a superlattice 34 with a plurality of layers 36 including B "barrier" layers that provide tunneling barriers indicated by large effective masses and that minority carriers must tunnel through in order to diffuse to the active region 12. Layer 36 also include narrow gap 'A' "well" layers adjacent 'B' "barrier" layers where the carriers prefer to reside, and which require the carriers to tunnel into the barriers to reach the active region 12. This structure also permits the use of a thinner exclusion region 16 which is easier to manufacture with higher accuracy. When a p-type superlattice 34 is desired, the superlattice is grown on top of the active region 12 (step 156) and under a doping diffusion layer (step 158), which is then heated to diffuse to dope the superlattice 34 without damaging atomic structure.

While various embodiments of the present invention have been described, it should be understood that other modifications and alternatives can be made without departing from the spirit and scope of the invention, which should be determined from the appended claims.

What is claimed is:

1. A method of forming a diode, comprising the steps of:
   forming a superlattice exclusion region configured for inhibiting diffusion of minority carriers from said exclusion region to an active region in said diode, including
   forming a first layer which forms a barrier that is penetrated by minority carriers using quantum mechanical tunneling and which reduces the mobility of said minority carriers, and
   forming a second layer on the first layer, said second layer having a sufficiently low energy band gap for requiring said minority carriers to perform said tunneling to reach said active region;
   repeating both said forming steps for forming a stack of first and second layers and defining a growth direction in which said layers are piled; and
   performing said repeating step until said thickness of said exclusion region in said growth direction is at least three times a diffusion length of said minority carrier.

2. The method of claim 1, wherein said repeating step is performed until said superlattice has at least 100 layers.

3. The method of claim 1, wherein said repeating step is performed until said superlattice has approximately at most 2110 layers.

4. The method of claim 1, wherein said repeating step is perfomed until said superlattice is at most 19 micrometers thick.

5. The method of claim 1, wherein depositing said first layer includes depositing at least one selected from the group containing
   (a) CdTe,
   (b) $Hg_{(1-y)}Cd_yTe$ where said second layer is $Hg_{(1-x)}Cd_xTe$ and where x does not equal y, and both x and y are less than 0.4,
   (c) $In_xGa_{(1-x)}Sb$ where x is less than 0.25 and when the minority carriers relative to the active region are holes, and
   (d) InAs when the minority carriers relative to the active region are electrons.

6. The method of claim 1, wherein depositing said second layer includes depositing at least one selected from the group containing:
   (a) HgTe,
   (b) $Hg_{(1-x)}Cd_xTe$ where said first layer is $Hg_{(1-y)}Cd_yTe$, and where x does not equal y, and where both x and y are less than 0.4,
   (c) InAs when the minority carriers relative to the active region are holes, and
   (d) $In_xGa_{(1-x)}Sb$ where x is less than 0.25 and when the minority carriers relative to the active region are electrons.

7. The method of claim 1, further comprising the steps of depositing a dopant diffusion layer on said superlatice exclusion layer; and
   diffusing dopant from said dopant diffusion layer into said superlattice exclusion layer.

8. The method of claim 1, wherein said dopant diffusion layer is a layer of Au.

9. The method of claim 1, wherein each layer is deposited to be 1–10 nm thick in said growth direction.

10. The method of claim 1, wherein said first layers are 4–10 nm thick.

11. The method of claim 1, wherein said second layers are 2–8 nm thick.

12. The method of claim 1 wherein said first layers are 'B' layers with a layer thickness $l_B$ and said second layers are 'A' layers with a layer thickness of $l_A$, and the method further comprising forming said 'A' layer with a decreased energy band gap compared to that of a non-superlattice bulk semiconductor material made of $A_xB_{(1-x)}$ wherein $x=l_A/(l_A+l_B)$ as said exclusion region.

13. The method of claim 1 wherein said first layers are 'B' layers with a layer thickness $l_B$ and said second layers are 'A' layers with a layer thickness of $l_A$, further comprising forming said first layer with a larger effective electron mass than an effective electron mass achieved when forming a non-superlattice bulk semiconductor layer material made of $A_xB_{(1-x)}$ wherein $x=l_A/(l_A+l_B)$ as said exclusion layer.

14. A method of forming a diode comprising the steps of:
   forming a plurality of thin layers of different compositions on top of each other to form a superlattice exclusion region of the diode;
   forming a dopant diffusion layer on said superlattice exclusion region; and
   diffusing dopant from said dopant diffusion layer into said superlattice exclusion region.

15. The method of claim 14, wherein said dopant diffusion layer is a layer of Au.

16. A method of operating a photodiode having an active region defining a majority carrier and a minority carrier, comprising the steps of
   heavily doping an exclusion region of the photodiode for reducing an electric field in said exclusion region so that the minority carriers in said exclusion region flow substantially by diffusion in presence of reverse bias; and
   reducing a flow of said minority carriers that diffuse to the active region by forcing said minority carriers to perform quantum mechanical tunneling through a plurality of second layers of a superlattice also having first layers where said minority carriers prefer to reside.

* * * * *